United States Patent
Uchida et al.

(10) Patent No.: US 12,164,081 B2
(45) Date of Patent: Dec. 10, 2024

(54) OPTICAL ELEMENT, OPTICAL SYSTEM, AND OPTICAL APPARATUS

(71) Applicant: CANON KABUSHIKI KAISHA, Tokyo (JP)

(72) Inventors: Kazue Uchida, Tochigi (JP); Masuo Ban, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 561 days.

(21) Appl. No.: 17/503,747

(22) Filed: Oct. 18, 2021

(65) Prior Publication Data
US 2022/0137265 A1    May 5, 2022

(30) Foreign Application Priority Data
Oct. 29, 2020   (JP) .................................. 2020-181840

(51) Int. Cl.
| | |
|---|---|
| *G02B 1/115* | (2015.01) |
| *H01L 27/146* | (2006.01) |
| *H04N 5/225* | (2006.01) |
| *H04N 23/55* | (2023.01) |

(52) U.S. Cl.
CPC .......... *G02B 1/115* (2013.01); *H01L 27/1462* (2013.01); *H04N 23/55* (2023.01)

(58) Field of Classification Search
CPC ... G02B 1/10; G02B 1/11; G02B 1/14; G02B 1/115; G02B 5/28; G02B 5/285; G02B 5/282; G02B 3/0062; H04N 23/55; H04N 5/225; H04N 5/2254; H01L 27/145; H01L 27/1462
USPC ........ 359/580, 581, 586, 588, 589, 359, 884
See application file for complete search history.

(56) References Cited

U.S. PATENT DOCUMENTS

| | | | |
|---|---|---|---|
| 10,353,117 B2 | 7/2019 | Abe | |
| 2005/0219724 A1* | 10/2005 | Teramoto | G02B 1/113 359/883 |
| 2016/0011414 A1 | 1/2016 | Joseph | |
| 2017/0090071 A1 | 3/2017 | Fukaya | |

FOREIGN PATENT DOCUMENTS

| | | |
|---|---|---|
| EP | 0382477 A1 | 8/1990 |
| EP | 3660548 A1 | 6/2020 |
| JP | 2002202401 A | 7/2002 |
| JP | 2003098307 A | 4/2003 |
| JP | 2012053329 A | 3/2012 |

(Continued)

OTHER PUBLICATIONS

Extended European Search Report issued in European Appln. No. 21202894.8 mailed on Mar. 2, 2022.

(Continued)

*Primary Examiner* — Jie Lei
(74) *Attorney, Agent, or Firm* — ROSSI, KIMMS & McDOWELL LLP

(57) ABSTRACT

An optical element includes a base material, which consists of resin material, and an antireflection film. The antireflection film consists of a first film formed on the base material and a second film formed on the first film. The second film consists of a first layer, a second layer, and a third layer, in order from a side closest to the first film. The first layer and the third layer each include silicon oxide. The second layer includes magnesium fluoride.

11 Claims, 11 Drawing Sheets

(56) References Cited

FOREIGN PATENT DOCUMENTS

| | | |
|---|---|---|
| JP | 2016519774 A | 7/2016 |
| JP | 2017134404 A | 8/2017 |
| JP | 2019003215 A | 1/2019 |
| WO | 2015093322 A1 | 6/2015 |

OTHER PUBLICATIONS

"High-refractive-index polymer" Wikipedia. Oct. 8, 2021 :pp. 1-8. XP055894483. Retrieved from the Internet: URL:https://en.wikipedia.org/wiki/High-refractive-index_polymer [retrieved on Feb. 22, 2022].

* cited by examiner

OPTICAL ELEMENT, OPTICAL SYSTEM, AND OPTICAL APPARATUS

BACKGROUND OF THE INVENTION

Field of the Invention

The present disclosure relates to an optical element.

Description of the Related Art

Japanese Patent Application Laid-Open No. ("JP") 2002-202401 discloses an antireflection film having an outermost layer, which is a layer (silicon oxide layer) including $SiO_2$ or SiO as a principal component, and a next layer, which is a layer (magnesium fluoride layer) including $MgF_2$ as a principal component. JP 2017-134404 discloses an antireflection film consisting of a multi-laminated layer in which silicon oxide layers and tantalum oxide layers are alternately laminated, a magnesium fluoride layer formed on the multi-laminated layer, and a silicon oxide layer as an outermost layer formed on the magnesium fluoride layer.

However, with the configuration of the antireflection film described in JP 2002-202401 or JP 2017-134404, it is difficult to increase mechanical strength and environmental durability of an optical element because tensile stress of magnesium fluoride is strong. As a result, film cracking or film peeling may occur in the antireflection film on a lens made from resin material.

SUMMARY OF THE INVENTION

The present disclosure provides an optical element, an optical system, and an optical apparatus each of which has high mechanical strength and high environmental durability.

An optical element according to one aspect of the present disclosure includes a base material, which consists of resin material, and an antireflection film. The antireflection film consists of a first film formed on the base material and a second film formed on the first film. The second film consists of a first layer, a second layer, and a third layer, in order from a side closest to the first film. The first layer and the third layer each include silicon oxide. The second layer includes magnesium fluoride.

An optical system and an optical apparatus each of which includes the above optical element also constitute other aspects of the present disclosure.

Further features of the present invention will become apparent from the following description of exemplary embodiments with reference to the attached drawings.

DESCRIPTION OF THE EMBODIMENTS

Referring now to the accompanying drawings, a detailed description will be given of embodiments according to the present disclosure.

Figure 1:
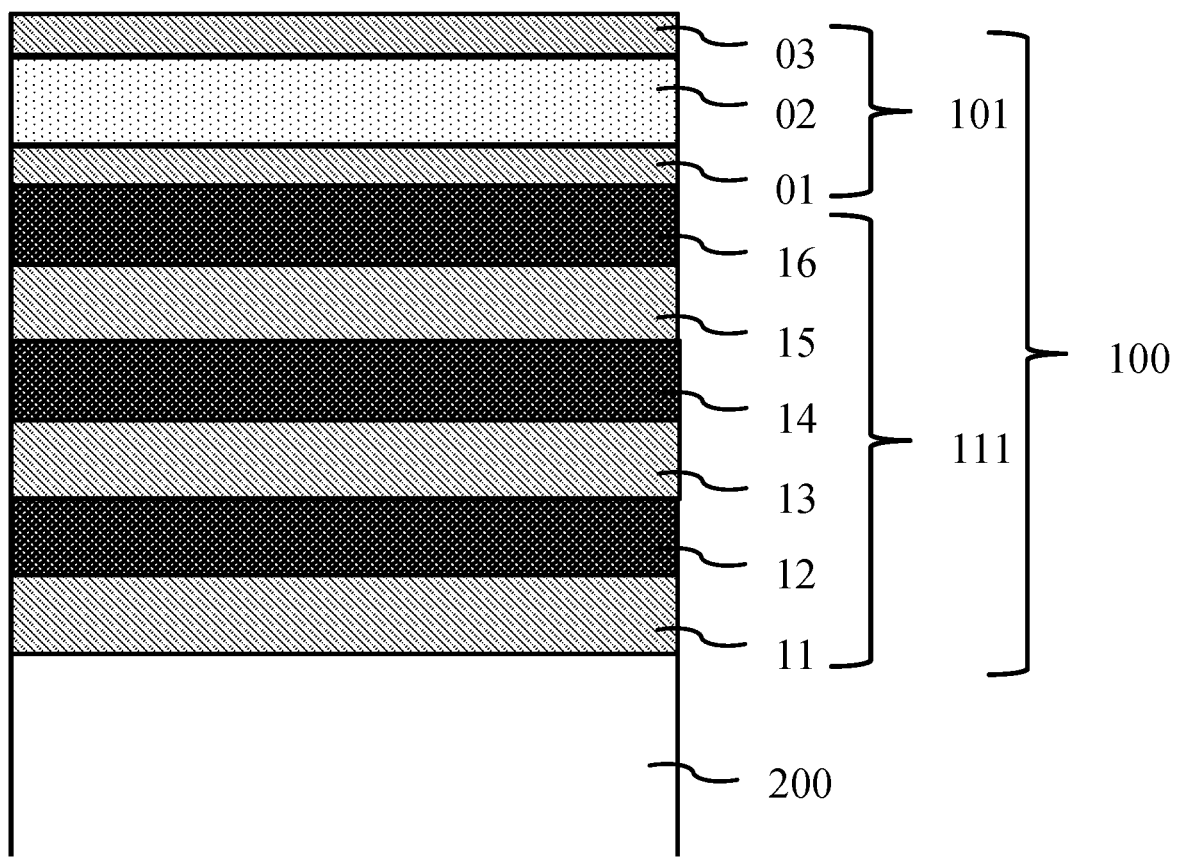
FIG. 1 is a schematic sectional view illustrating an optical element according to each example.

First, a description will be given of a schematic configuration of an optical element 300 in this embodiment with reference to FIG. 1. FIG. 1 is a schematic sectional view illustrating the optical element 300. The optical element 300 includes a transparent resin substrate 200 which is a base material consisting of resin material, and an antireflection film 100 formed on the transparent resin substrate 200. The antireflection film 100 includes a multilayer film 111 as a first film and a multilayer film 101 as a second film, in order from the side closer to the transparent resin substrate 200. That is, the antireflection film 100 consists of a multilayer film 111 formed on the transparent resin substrate 200 and a multilayer film 101 formed on the multilayer film 111, i.e., formed at a position farthest from the transparent resin substrate 200.

The multilayer film 111 consists of layers 11, 12, 13, 14, 15, and 16, in order from the side closer to the transparent resin substrate 200. In this embodiment, the multilayer film 111 consists of six layers, but the present disclosure is not limited to this. The number of layers of the multilayer film 111 may be any number as long as the multilayer film 111 consists of one or more layer. The multilayer film 101 consists of three layers of a layer 01 as a first layer, a layer 02 as a second layer, and a layer 03 as a third layer, in order from the side closer to the multilayer film 111. The layers 01 and 03 forming the multilayer film 101 each include silicon oxide ($SiO_2$), and the layer 02 includes magnesium fluoride ($MgF_2$). More specifically, the layers 01 and 03 each consist of silicon oxide, or each include silicon oxide as a principal component, that is, are layers each including silicon oxide at a weight ratio of 90% or more. The layer 02 consists of magnesium fluoride or includes magnesium fluoride as a principal component.

When the antireflection film 100 is vapor-deposited on the transparent resin substrate 200, it is necessary to form films with the transparent resin substrate 200 in a state of non-heated, or of heated at low temperature of 80 degrees or less. Magnesium fluoride vapor-deposited in the state of non-heated, or of heated at low temperature of 80 degrees or less, has low film strength and strong tensile stress. On the other hand, even when vapor-deposited in the state of non-heated, or of heated at a low temperature of 80 degrees or less, silicon oxide has high film strength and strong tensile stress. In this embodiment, a magnesium fluoride layer is sandwiched between silicon oxide layers as in the configuration of the multilayer film 101, so that the film strength can be improved and adhesion can be improved by canceling the stress.

In this embodiment, the following conditional expression (1) may be satisfied where n1, n2, and n3 respectively represent refractive indexes at a d-line of the layers 01, 02, and 03, d1, d2, and d3 (nm) respectively represent physical film thicknesses of the layers 01, 02, and 03, and λ represents a wavelength of the d-line.

$$\lambda/8 \leq n1d1+n2d2+n3d3 \leq \lambda/2 \tag{1}$$

In this embodiment, the numerical range of the conditional expression (1) may be set to that in the following conditional expression (1a).

$$\lambda/6 \leq n1d1+n2d2+n3d3 \leq \lambda/3 \tag{1a}$$

In the antireflection film 100, antireflection performance is improved when the outermost layer, i.e., a top layer, is made from material having a low refractive index and an optical film thickness of the outermost layer is set to about λ/4. In this embodiment, the antireflection performance can be improved by regarding the multilayer film 101 as a layer substantially equivalent to the low refractive index material of the outermost layer and satisfying the conditional expression (1).

In this embodiment, the following conditional expressions (2) and (3) may be satisfied.

$$0.2 \leq n2d2/(n1d1+n2d2+n3d3) \leq 0.9 \tag{2}$$

$$0.5 \leq n1d1/n3d3 \leq 2.0 \tag{3}$$

In this embodiment, the numerical ranges of the conditional expressions (2) and (3) may be set to those in the following conditional expressions (2a) and (3a).

$$0.3 \leq n2d2/(n1d1+n2d2+n3d3) \leq 0.7 \tag{2a}$$

$$0.8 \leq d1/d3 \leq 1.2 \tag{3a}$$

If the film thickness of the layer 02 of the multilayer film 101 increases, an average refractive index of the multilayer film 101 decreases, but the film strength decreases, and tensile stress increases and makes it difficult to ensure adhesion. On the other hand, if the film thicknesses of the layers 01 and 03 increase, the film strength improves and the tensile stress decreases and makes it easy to ensure the adhesion, but the average refractive index of the multilayer film 101 increases. When the films are formed so that the respective film thicknesses satisfy the conditional expressions (2) and (3), it is possible to ensure both antireflection performance and film strength.

The transparent resin substrate 200 expands as the temperature rises. Magnesium fluoride has a large tensile stress. Generally, vapor-deposited films made from silicon oxide have compressive stress, but stronger compressive stress is required to offset the stress of magnesium fluoride. In this embodiment, the compressive stress is enhanced by using silicon oxide material including a small amount of aluminum. Therefore, material forming the layers 01 and 03 may be material including silicon oxide as a principal component and a small amount of aluminum. The refractive indexes n1 and n3 may satisfy the following conditional expressions (4) and (5), respectively.

$$1.4 \leq n1 \leq 1.5 \tag{4}$$

$$1.4 \leq n3 \leq 1.5 \tag{5}$$

Each of the layers 01 and 03 may include aluminum at a weight ratio of 10% or less. The addition of aluminum is effective even when the added amount is very small. Even a silicon oxide film including aluminum at a weight ratio of 0.001% can hinder film cracking and film peeling from occurring when combined with a magnesium fluoride film.

The multilayer film 111 may be a combination of high refractive index material and medium refractive index material, which has a refractive index at the d-line of about 1.6 to 1.8, but may be a layer (alternate layer) formed by alternately laminating high refractive index material and low refractive index material. The high refractive index material used in the multilayer film 111 may be one of tantalum oxide, titanium oxide, lanthanum oxide, and zirconium oxide, or may be material whose principal component is a mixture of more than one of them. The high refractive index material has tensile stress. The low refractive index material used in the multilayer film 111 may be the same material as the layers 01 and 03 so as to be easily manufactured and to offset the stress of the antireflection film 100. Since the high refractive index material has the tensile stress and the low refractive index material has the compressive stress, the stress is offset by forming the alternate layer. The alternate layer is not limited to the six layers as illustrated in FIG. 1, as long as the alternate layer includes at least one layer for each of two types of layers made from material different from each other.

A layer 11 which is a bottom layer of the multilayer film 111 may be made from the same material as the layers 01 and 03. The transparent resin substrate 200 generally has a thermal expansion coefficient larger than that of glass. When material having strong compressive stress is used on the transparent resin substrate 200, the layer 11 can follow a shape variation of the transparent resin substrate 200 expanding due to high temperature, and hindering film cracking from occurring.

A film forming method for the antireflection film 100 consisting of the multilayer film 111 and the multilayer film 101 is not particularly limited as long as it is physical vapor deposition such as vapor deposition, a sputtering method, and an ion plating method. In particular, vapor deposition may be used because fluoride is less likely to decompose. In vapor deposition, heating methods for vapor deposition material include electrical resistance heating, electron-beam physical vapor deposition, pulsed laser deposition, and the like. Electron-beam physical vapor deposition may be used because it can form a film with a substrate in a non-heated state by directly heating film material, and can provide a film of relatively high quality with small amount of contamination. An ion beam assist method may also be used. By an independent ion source playing a role of assisting vapor deposition, it is possible to form a dense film with low absorption and scattering and high strength.

In this embodiment, the following conditional expression (6) may be satisfied where nd represents a refractive index (average refractive index at the d-line) of the transparent resin substrate 200.

$$1.48 \leq nd \leq 1.80$$

Further, in this embodiment, the following conditional expression (7) may be satisfied where α ($10^{-5}$/° C.) represents a coefficient of linear expansion of the transparent resin substrate 200.

$$1.5 \leq \alpha \leq 30.0$$

A detailed description will be given below of each example.

Example 1

FIG. 1 is a schematic sectional view of an optical element 300 in an Example 1 of the present disclosure. The optical element 300 in this example is an optical element in which an antireflection film 100 is formed on a transparent resin substrate 200. The transparent resin substrate 200 is made from COP resin (Zeon Corporation, "ZEONEX") having a refractive index of 1.53 (at the d-line). As layer material, layers 11, 13, 15, 01, and 03 use $SiO_2$, layers 12, 14, and 16 use mixture of $ZrO_2$ and $TiO_2$, and a layer 02 uses $MgF_2$. Table 1 indicates details of a film configuration of the optical element in this example. A refractive index and a film thickness of each material satisfy the expressions (1), (2), and (3).

A film forming method for the antireflection film 100 in this example is as follows. The antireflection film 100 is formed by vapor deposition. An electron beam was used to heat evaporation material. Ion beam-assisted vapor deposition was performed to form a denser film. The inside of a vacuum chamber of a vapor deposition apparatus was exhausted in a non-heated state up to a high-vacuum range of about $2 \times 10^{-3}$ (Pa). After it was ensured that the inside of the vacuum chamber was in the high vacuum state, Ar as inert gas was introduced into an ion gun and the ion gun was discharged. After the ion gun became a stable state, oxygen was introduced into the vacuum chamber, and ion assisted vapor deposition using oxygen ion was performed at a vacuum pressure of about $1 \times 10^{-2}$ (Pa).

Figure 2:
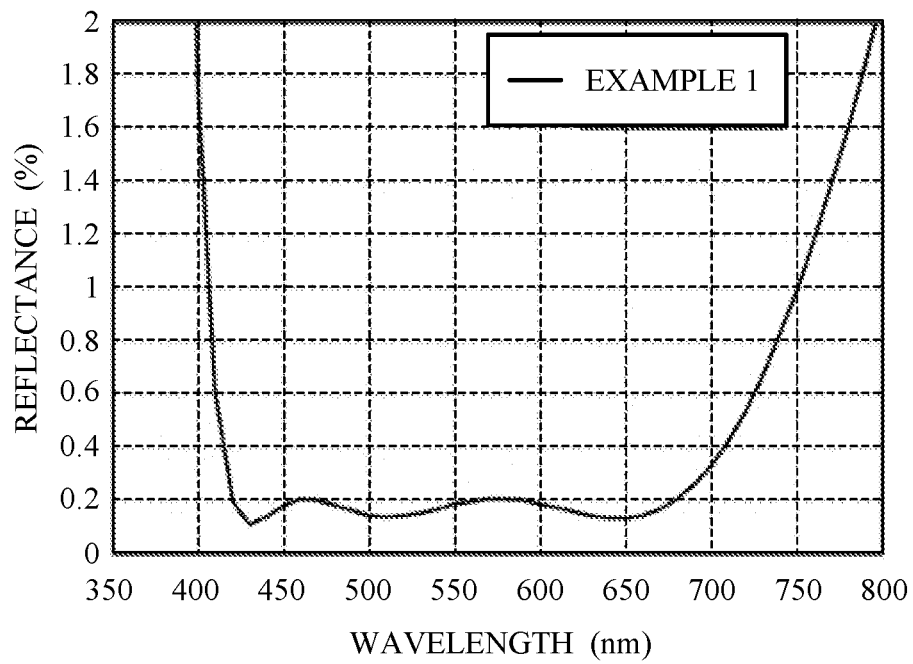
FIG. 2 indicates a reflectance characteristic at an incident angle of 0 degree of an optical element according to an Example 1.

FIG. 2 indicates a reflectance characteristic of the optical element in this example. In FIG. 2, a horizontal axis represents wavelength (nm) and a vertical axis represents reflectance (%). The reflectance is 0.25% or less in a wavelength range of 420 to 680 nm, which is a very good characteristic.

The layer 02 made from magnesium fluoride is formed by non-heating vapor deposition, and has low strength and strong tensile stress. On the other hand, a layer of silicon oxide formed by non-heating vapor deposition has high strength and has compressive stress. The multilayer film 101 with magnesium fluoride film sandwiched between silicon oxide films as a whole has a structure in which strength is high and stress is offset, and is a film with good environmental reliability that does not cause cracking or peeling.

The antireflection film 100 was subjected to the following durability tests for confirming its durability under various conditions.

High-Temperature High-Humidity Shelf Test

A prepared sample was left for 1000 hours in a constant temperature bath set to a temperature of 60 degrees and a humidity of 90%, and thereafter the appearance of the antireflection film 100 was visually observed.

Low-Temperature Shelf Test

A prepared sample was left for 1000 hours in a constant temperature bath set to a temperature of −30 degrees, and thereafter the appearance of the antireflection film 100 was visually observed.

High-Temperature Shelf Test

A prepared sample was left for 12 hours in a constant temperature bath set to 70 degrees, and thereafter the appearance of the antireflection film 100 was visually observed.

Adhesion Test

Adhesive tape was put on a surface of the antireflection film 100 of a prepared sample, and the tape was peeled off in a direction perpendicular to the film surface. It was repeated five times and whether or not the film had peeled off was confirmed by visual observation.

Surface Hardness Test

After the antireflection film 100 was rubbed for ten times back and forth with a lens-cleaning paper soaked with solvent with a load of about 200 g applied, the appearance of the antireflection film 100 was visually observed.

Table 18 indicates the results of the durability tests. It could be confirmed that no film cracking or film peeling occurred in every test, and that a good antireflection film was formed.

TABLE 1

| | | Refractive index (d-line) | Physical film thickness (nm) |
|---|---|---|---|
| Multilayer film 101 | Layer 03 $SiO_2$ | 1.45 | 20.0 |
| | Layer 02 $MgF_2$ | 1.38 | 58.3 |
| | Layer 01 $SiO_2$ | 1.45 | 20.0 |
| Multilayer film 111 | Layer 16 $ZrO_2 + TiO_2$ | 2.00 | 56.6 |
| | Layer 15 $SiO_2$ | 1.45 | 15.0 |
| | Layer 14 $ZrO_2 + TiO_2$ | 2.00 | 53.7 |
| | Layer 13 $SiO_2$ | 1.45 | 51.2 |
| | Layer 12 $ZrO_2 + TiO_2$ | 2.00 | 15.5 |
| | Layer 11 $SiO_2$ | 1.45 | 54.6 |
| Resin substrate 200 | COP resin | 1.53 | — |

Example 2

Figure 3:
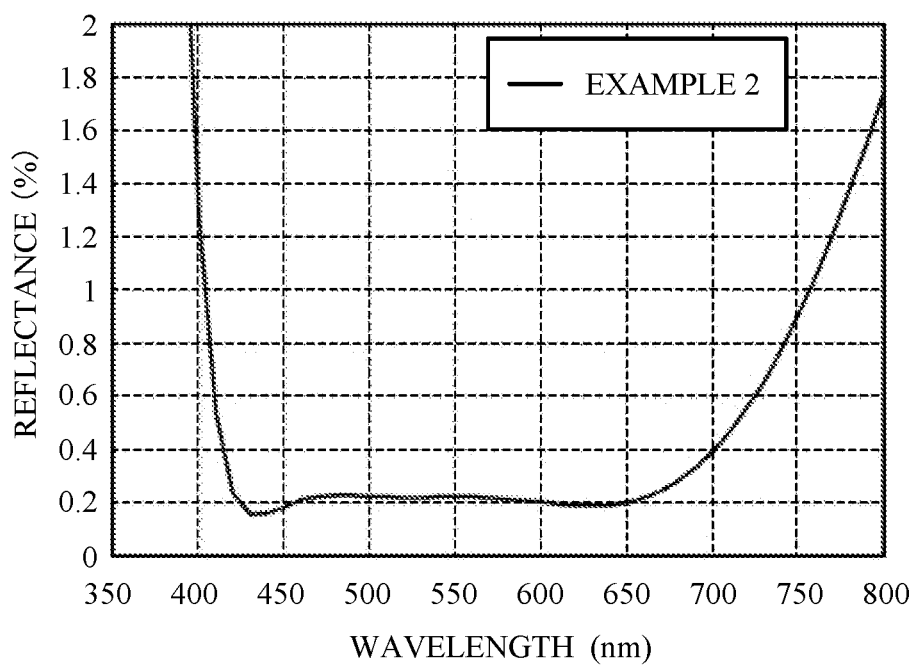
FIG. 3 indicates a reflectance characteristic at an incident angle of 0 degree of an optical element according to an Example 2.

An optical element in an Example 2 is made by using the same transparent resin substrate, the same vapor deposition material, and the same vapor deposition condition as those in the Example 1. Table 2 indicates details of a film configuration of the optical element in this example. A refractive index and a film thickness of each material satisfy the expressions (1), (2), and (3). FIG. 3 indicates a reflectance characteristic of the optical element in this example. In FIG. 3, a horizontal axis represents wavelength (nm) and a vertical axis represents reflectance (%). The reflectance is 0.25% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 2

|  |  | Refractive index (d-line) | Physical film thickness (nm) |
|---|---|---|---|
| Multilayer film 101 | Layer 03 $SiO_2$ | 1.45 | 20.0 |
|  | Layer 02 $MgF_2$ | 1.38 | 59.0 |
|  | Layer 01 $SiO_2$ | 1.45 | 20.0 |
| Multilayer film 111 | Layer 15 $ZrO_2 + TiO_2$ | 2.00 | 50.3 |
|  | Layer 14 $SiO_2$ | 1.45 | 15.0 |
|  | Layer 13 $ZrO_2 + TiO_2$ | 2.00 | 57.8 |
|  | Layer 12 $SiO_2$ | 1.45 | 37.3 |
|  | Layer 11 $ZrO_2 + TiO_2$ | 2.00 | 15.4 |
| Resin substrate 200 | COP resin | 1.53 | — |

Example 3

Figure 4:
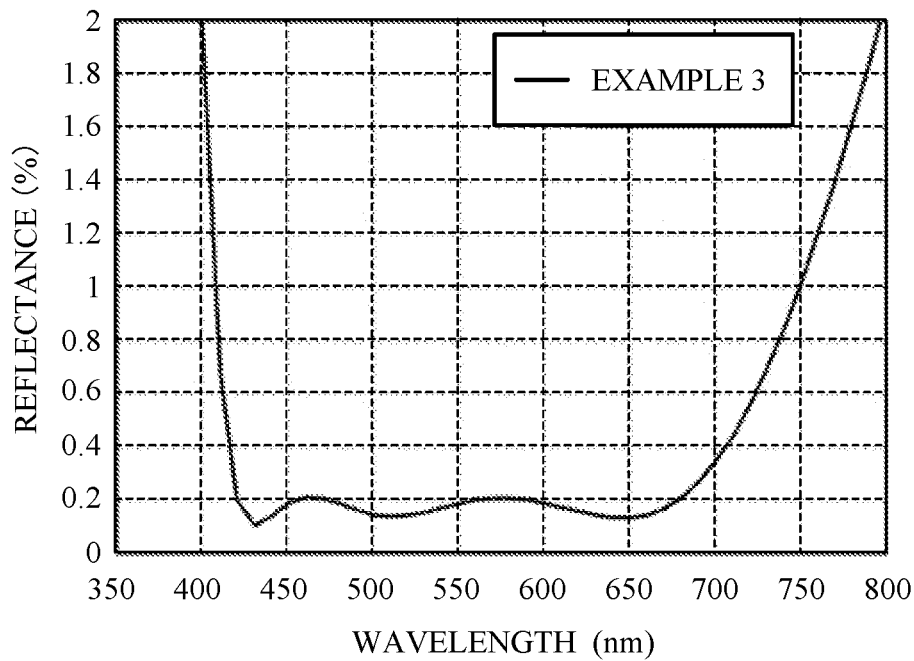
FIG. 4 indicates a reflectance characteristic at an incident angle of 0 degree of an optical element according to an Example 3.

A transparent resin substrate 200 in an Example 3 is made from special PC resin (Mitsubishi Gas Chemical Company, Inc., "EP-5000"). As layer material, layers 11, 13, 15, 01, and 03 use $SiO_2$ including Al at a weight ratio of 0.001%, layers 12, 14, and 16 use mixture of $Ta_2O_5$ and $TiO_2$, and a layer 02 uses $MgF_2$. Table 3 indicates details of a film configuration of the optical element in this example. A refractive index and a film thickness of each material satisfy the expressions (1), (2), and (3). A film forming method for an antireflection film 100 in this example is electron-beam physical vapor deposition and ion-assisted vapor deposition as in the Example 1. FIG. 4 indicates a reflectance characteristic of the optical element in this example. In FIG. 4, a horizontal axis represents wavelength (nm) and a vertical axis represents reflectance (%). The reflectance is 0.25% or less in a wavelength range of 420 to 680 nm, which is a very good characteristic.

Table 18 indicates the results of the durability tests. It could be confirmed that no film cracking or film peeling occurred in every test, and that a good antireflection film was formed.

In this example, the layer 01 and the layer 03 are $SiO_2$ layers each including Al at the weight ratio of 0.001%. These layers have very strong compressive stress. $MgF_2$ has very strong tensile stress, and resin material is very likely to expand. According to this example, these stresses are offset, and thus it is possible to provide an antireflection film having a very high environmental durability.

TABLE 3

|  |  | Refractive index (d-line) | Physical film thickness (nm) |
|---|---|---|---|
| Multilayer film 101 | Layer 03 $SiO_2$ (Al content: weight ratios 0.001%) | 1.45 | 20.0 |
|  | Layer 02 $MgF_2$ | 1.38 | 60.9 |
|  | Layer 01 $SiO_2$ (Al content: weight ratios 0.001%) | 1.45 | 18.0 |
| Multilayer film 111 | Layer 16 $Ta_2O_5 + TiO_2$ | 2.00 | 55.9 |
|  | Layer 15 $SiO_2$ (Al content: weight ratios 0.001%) | 1.45 | 15.0 |
|  | Layer 14 $Ta_2O_5 + TiO_2$ | 2.00 | 57.7 |
|  | Layer 13 $SiO_2$ (Al content: weight ratios 0.001%) | 1.45 | 47.1 |
|  | Layer 12 $Ta_2O_5 + TiO_2$ | 2.00 | 22.4 |
|  | Layer 11 $SiO_2$ (Al content: weight ratios 0.001%) | 1.45 | 38.8 |
| Resin substrate 200 | Special PC | 1.64 | — |

Example 4

Figure 5:
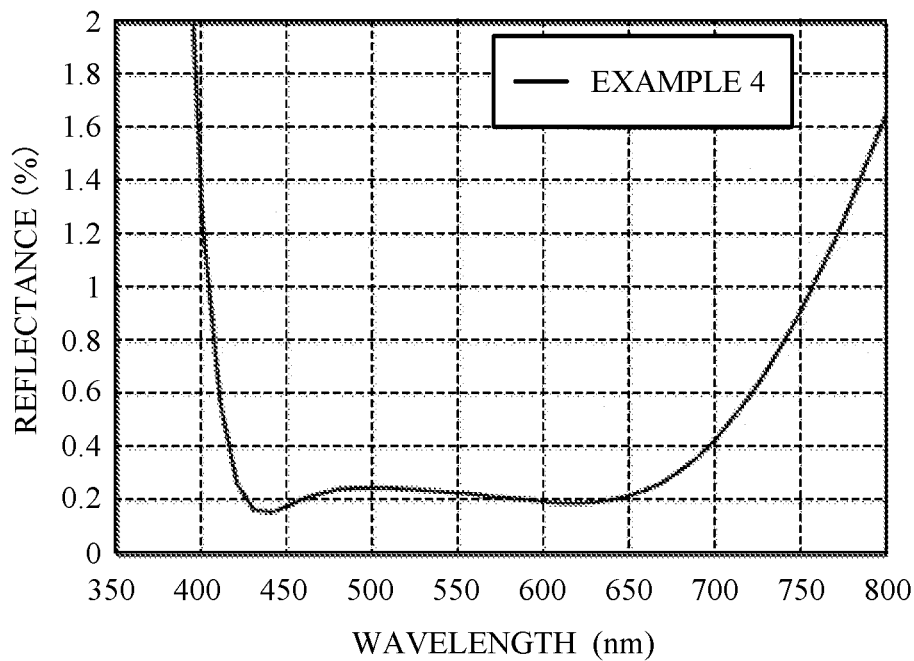
FIG. 5 indicates a reflectance characteristic at an incident angle of 0 degree of an optical element according to an Example 4.

A transparent resin substrate 200 in an Example 4 is made from special PC resin (Mitsubishi Gas Chemical Company, Inc., "EP-5000"). As layer material, layers 12, 14, 01, and 03 use $SiO_2$ including Al at a weight ratio of 1.0%, layers 11, 13, and 15 use mixture of $ZrO_2$ and $TiO_2$, and a layer 02 uses $MgF_2$. Table 4 indicates details of a film configuration of the optical element in this example. A refractive index and a film thickness of each material satisfy the expressions (1), (2), and (3). FIG. 5 indicates a reflectance characteristic of the optical element in this example. In FIG. 5, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 4

|  |  | Refractive index (d-line) | Physical film thickness (nm) |
|---|---|---|---|
| Multilayer film 101 | Layer 03 $SiO_2$ (Al content: weight ratios 1.0%) | 1.45 | 18.0 |
|  | Layer 02 $MgF_2$ | 1.38 | 62.1 |
|  | Layer 01 $SiO_2$ (Al content: weight ratios 1.0%) | 1.45 | 20.0 |

TABLE 4-continued

|  |  |  | Refractive index (d-line) | Physical film thickness (nm) |
|---|---|---|---|---|
| Multilayer film 111 | Layer 15 | $ZrO_2 + TiO_2$ | 2.00 | 47.1 |
|  | Layer 14 | $SiO_2$ (Al content: weight ratios 1.0%) | 1.45 | 15.0 |
|  | Layer 13 | $ZrO_2 + TiO_2$ | 2.00 | 61.7 |
|  | Layer 12 | $SiO_2$ (Al content: weight ratios 1.0%) | 1.45 | 27.8 |
|  | Layer 11 | $ZrO_2 + TiO_2$ | 2.00 | 17.5 |
| Resin substrate 200 |  | Special PC | 1.64 | — |

Example 5

Figure 6:
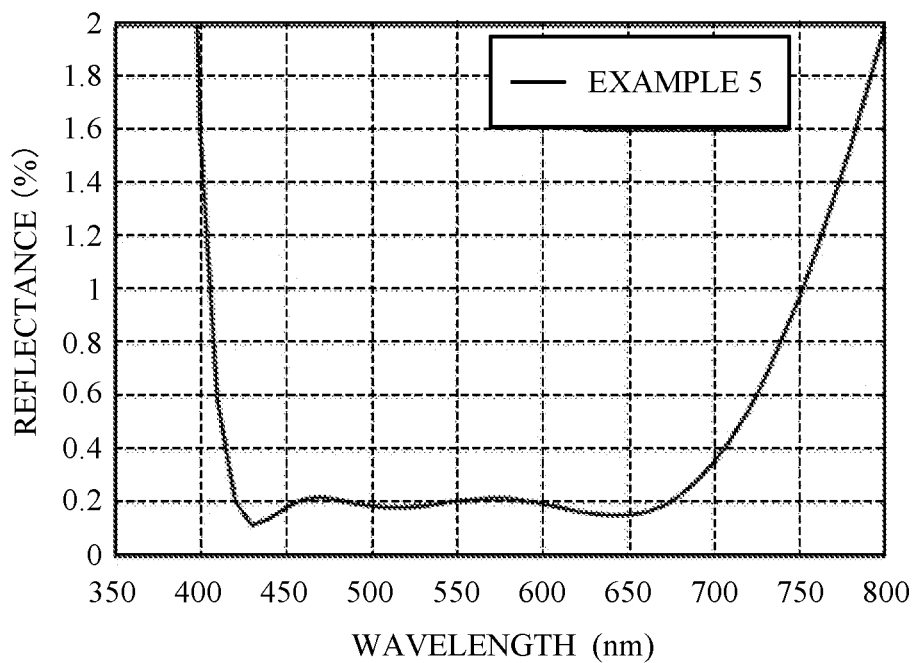
FIG. 6 indicates a reflectance characteristic at an incident angle of 0 degree of an optical element according to an Example 5.

A transparent resin substrate 200 in an Example 5 is made from COP resin (Zeon Corporation, "ZEONEX"). As layer material, layers 11, 13, 15, 01, and 03 use $SiO_2$ including Al at a weight ratio of 2.0%, layers 12, 14, and 16 use mixture of $Ta_2O_5$ and $TiO_2$, and a layer 02 uses $MgF_2$. Table 5 indicates details of a film configuration of the optical element in this example. A refractive index and a film thickness of each material satisfy the expressions (1), (2), and (3). FIG. 6 indicates a reflectance characteristic of the optical element in this example. In FIG. 6, a horizontal axis represents wavelength (nm) and a vertical axis represents reflectance (%). The reflectance is 0.25% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 5

|  |  |  | Refractive index (d-line) | Physical film thickness (nm) |
|---|---|---|---|---|
| Multilayer film 101 | Layer 03 | $SiO_2$ (Al content: weight ratios 2.0%) | 1.46 | 19.5 |
|  | Layer 02 | $MgF_2$ | 1.38 | 55.9 |
|  | Layer 01 | $SiO_2$ (Al content: weight ratios 2.0%) | 1.46 | 23.0 |
| Multilayer film 111 | Layer 16 | $Ta_2O_5 + TiO_2$ | 2.00 | 56.4 |
|  | Layer 15 | $SiO_2$ (Al content: weight ratios 2.0%) | 1.46 | 15.0 |
|  | Layer 14 | $Ta_2O_5 + TiO_2$ | 2.00 | 53.6 |
|  | Layer 13 | $SiO_2$ (Al content: weight ratios 2.0%) | 1.46 | 51.0 |
|  | Layer 12 | $Ta_2O_5 + TiO_2$ | 2.00 | 15.0 |
|  | Layer 11 | $SiO_2$ (Al content: weight ratios 2.0%) | 1.46 | 53.8 |
| Resin substrate 200 |  | COP resin | 1.53 | — |

Example 6

Figure 7:
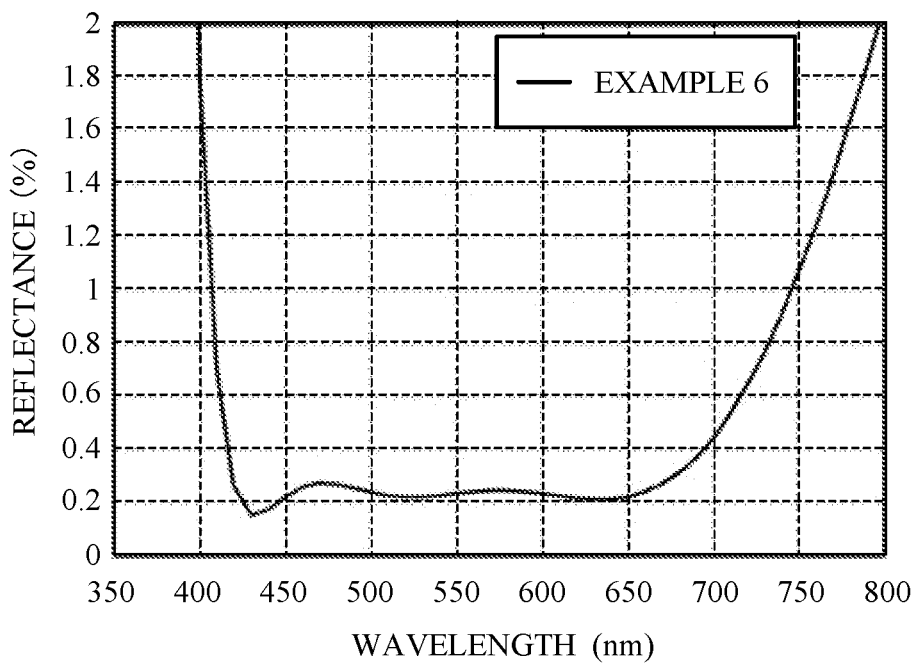
FIG. 7 indicates a reflectance characteristic at an incident angle of 0 degree of an optical element according to an Example 6.

A transparent resin substrate 200 in an Example 6 is made from COP resin (Zeon Corporation, "ZEONEX"). As layer material, layers 11, 13, 15, 01, and 03 use $SiO_2$ including Al at a weight ratio of 3.0%, layers 12, 14, and 16 use mixture of $Ta_2O_5$ and $TiO_2$, and a layer 02 uses $MgF_2$. Table 6 indicates details of a film configuration of the optical element in this example. A refractive index and a film thickness of each material satisfy the expressions (1), (2), and (3). FIG. 7 indicates a reflectance characteristic of the optical element in this example. In FIG. 7, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 6

|  |  |  | Refractive index (d-line) | Physical film thickness (nm) |
|---|---|---|---|---|
| Multilayer film 101 | Layer 03 | $SiO_2$ (Al content: weight ratios 3.0%) | 1.46 | 29.0 |
|  | Layer 02 | $MgF_2$ | 1.38 | 40.2 |
|  | Layer 01 | $SiO_2$ (Al content: weight ratios 3.0%) | 1.46 | 27.5 |
| Multilayer film 111 | Layer 16 | $Ta_2O_5 + TiO_2$ | 2.00 | 59.5 |
|  | Layer 15 | $SiO_2$ (Al content: weight ratios 3.0%) | 1.46 | 15.0 |
|  | Layer 14 | $Ta_2O_5 + TiO_2$ | 2.00 | 51.5 |
|  | Layer 13 | $SiO_2$ (Al content: weight ratios 3.0%) | 1.46 | 52.0 |
|  | Layer 12 | $Ta_2O_5 + TiO_2$ | 2.00 | 15.0 |
|  | Layer 11 | $SiO_2$ (Al content: weight ratios 3.0%) | 1.46 | 51.1 |
| Resin substrate 200 |  | COP resin | 1.53 | — |

Example 7

Figure 8:
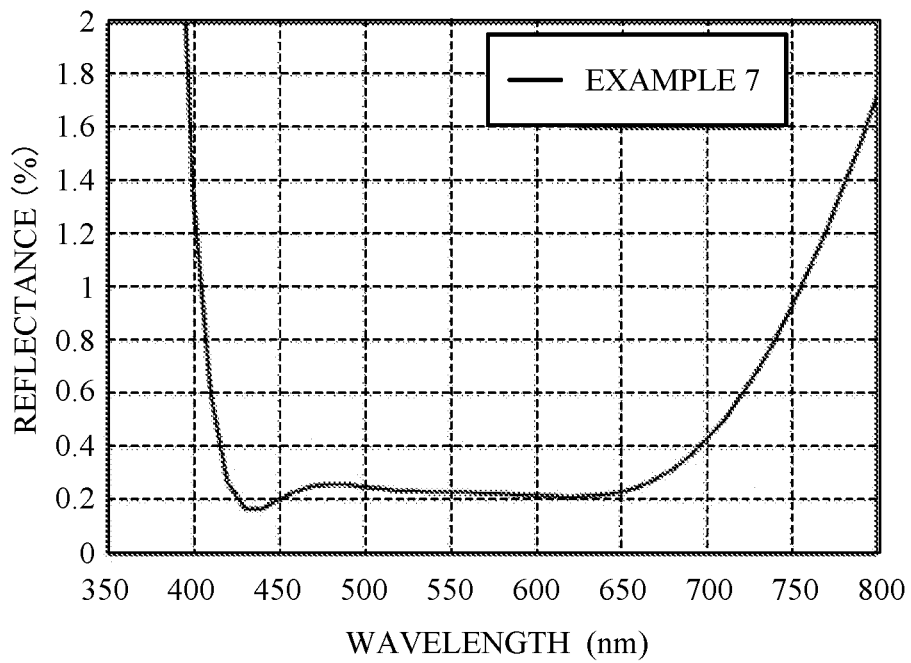
FIG. 8 indicates a reflectance characteristic at an incident angle of 0 degree of an optical element according to an Example 7.

A transparent resin substrate 200 in an Example 7 is made from COP resin (Zeon Corporation, "ZEONEX"). As layer material, layers 12, 14, 01, and 03 use $SiO_2$ including Al at a weight ratio of 2.0%, layers 11, 13, and 15 use mixture of $Ta_2O_5$ and $TiO_2$, and a layer 02 uses $MgF_2$. Table 7 indicates details of a film configuration of the optical element in this example. A refractive index and a film thickness of each material satisfy the expressions (1), (2), and (3). FIG. 8 indicates a reflectance characteristic of the optical element in this example. In FIG. 8, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 7

|  |  |  | Refractive index (d-line) | Physical film thickness (nm) |
|---|---|---|---|---|
| Multilayer film 101 | Layer 03 | $SiO_2$ (Al content: weight ratios 2.0%) | 1.46 | 25.0 |
|  | Layer 02 | $MgF_2$ | 1.38 | 57.1 |
|  | Layer 01 | $SiO_2$ (Al content: weight ratios 2.0%) | 1.46 | 15.0 |
| Multilayer film 111 | Layer 15 | $Ta_2O_5 + TiO_2$ | 2.00 | 52.1 |
|  | Layer 14 | $SiO_2$ (Al content: weight ratios 2.0%) | 1.46 | 15.0 |
|  | Layer 13 | $Ta_2O_5 + TiO_2$ | 2.00 | 57.3 |
|  | Layer 12 | $SiO_2$ (Al content: weight ratios 2.0%) | 1.46 | 39.1 |
|  | Layer 11 | $Ta_2O_5 + TiO_2$ | 2.00 | 15.0 |
| Resin substrate 200 |  | COP resin | 1.53 | — |

Example 8

Figure 9:
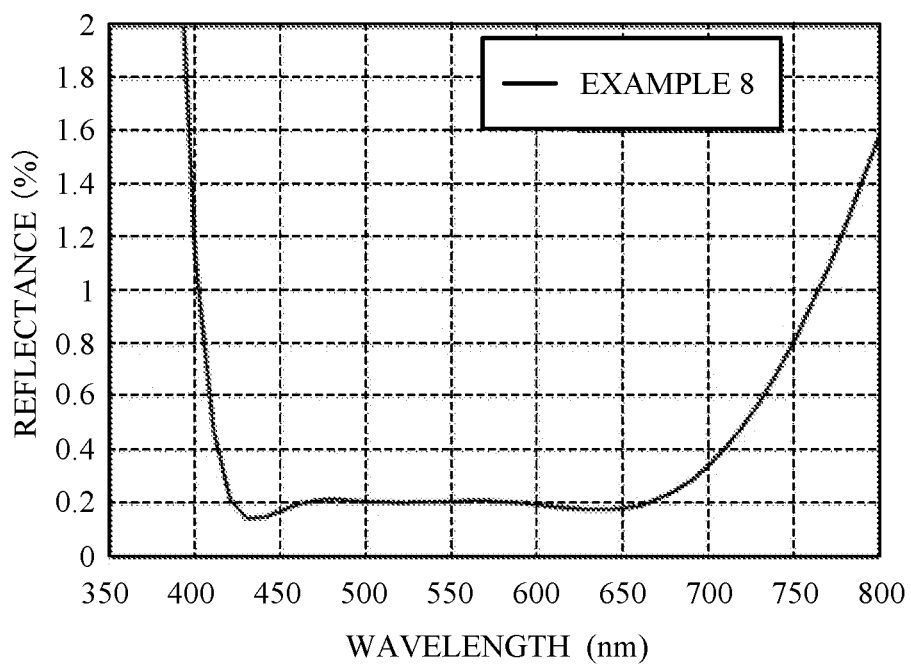
FIG. 9 indicates a reflectance characteristic at an incident angle of 0 degree of an optical element according to an Example 8.

A transparent resin substrate 200 in an Example 8 is made from special PC resin (Mitsubishi Gas Chemical Company, Inc., "EP-5000"). As layer material, layers 11, 13, 15, 01, and 03 use $SiO_2$ including Al at a weight ratio of 3.0%, layers 12, 14 and, 16 use mixture of $Ta_2O_5$ and $TiO_2$, and a layer 02 uses $MgF_2$. Table 8 indicates details of a film configuration of the optical element in this example. A refractive index and a film thickness of each material satisfy the expressions (1), (2), and (3). FIG. 9 indicates a reflectance characteristic of the optical element in this example. In FIG. 9, a horizontal axis represents wavelength (nm) and a vertical axis represents reflectance (%). The reflectance is 0.25% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 8

|  |  |  | Refractive index (d-line) | Physical film thickness (nm) |
|---|---|---|---|---|
| Multilayer film 101 | Layer 03 | SiO$_2$ (Al content: weight ratios 3.0%) | 1.46 | 20.0 |
|  | Layer 02 | MgF$_2$ | 1.38 | 60.9 |
|  | Layer 01 | SiO$_2$ (Al content: weight ratios 3.0%) | 1.46 | 18.0 |
| Multilayer film 111 | Layer 16 | Ta$_2$O$_5$ + TiO$_2$ | 2.00 | 55.9 |
|  | Layer 15 | SiO$_2$ (Al content: weight ratios 3.0%) | 1.46 | 15.0 |
|  | Layer 14 | Ta$_2$O$_5$ + TiO$_2$ | 2.00 | 57.7 |
|  | Layer 13 | SiO$_2$ (Al content: weight ratios 3.0%) | 1.46 | 47.1 |
|  | Layer 12 | Ta$_2$O$_5$ + TiO$_2$ | 2.00 | 22.4 |
|  | Layer 11 | SiO$_2$ (Al content: weight ratios 3.0%) | 1.46 | 38.8 |
| Resin substrate 200 |  | Special PC | 1.64 | — |

Example 9

Figure 10:
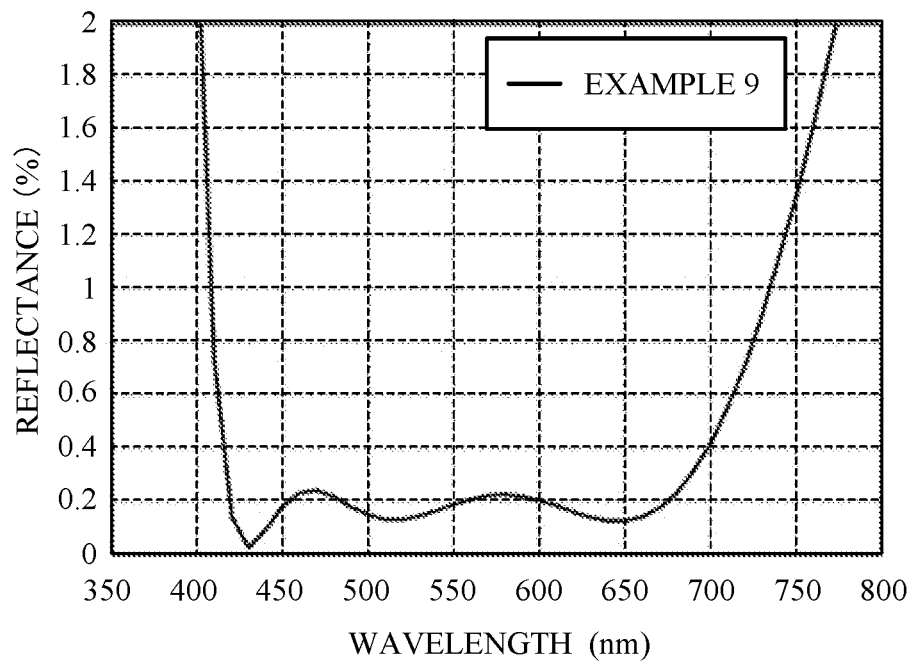
FIG. 10 indicates a reflectance characteristic at an incident angle of 0 degree of an optical element according to an Example 9.

A transparent resin substrate 200 in an Example 9 is made from special PC resin (Mitsubishi Gas Chemical Company, Inc., "EP-5000"). As layer material, layers 11, 13, 15, 01, and 03 use SiO$_2$ including Al at a weight ratio of 2.5%, layers 12, 14, and 16 use mixture of Ta$_2$O$_5$ and TiO$_2$, and a layer 02 uses MgF$_2$. Table 9 indicates details of a film configuration of the optical element in this example. A refractive index and a film thickness of each material satisfy the expressions (1), (2), and (3). FIG. 10 indicates a reflectance characteristic of the optical element in this example. In FIG. 10, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 9

|  |  |  | Refractive index (d-line) | Physical film thickness (nm) |
|---|---|---|---|---|
| Multilayer film 101 | Layer 03 | SiO$_2$ (Al content: weight ratios 2.5%) | 1.46 | 15.0 |
|  | Layer 02 | MgF$_2$ | 1.38 | 67.7 |
|  | Layer 01 | SiO$_2$ (Al content: weight ratios 2.5%) | 1.46 | 12.0 |
| Multilayer film 111 | Layer 16 | Ta$_2$O$_5$ + TiO$_2$ | 2.00 | 59.8 |
|  | Layer 15 | SiO$_2$ (Al content: weight ratios 2.5%) | 1.46 | 15.0 |
|  | Layer 14 | Ta$_2$O$_5$ + TiO$_2$ | 2.00 | 52.1 |
|  | Layer 13 | SiO$_2$ (Al content: weight ratios 2.5%) | 1.46 | 63.9 |
|  | Layer 12 | Ta$_2$O$_5$ + TiO$_2$ | 2.00 | 15.0 |
|  | Layer 11 | SiO$_2$ (Al content: weight ratios 2.5%) | 1.46 | 59.5 |
| Resin substrate 200 |  | Special PC | 1.64 | — |

Example 10

Figure 11:
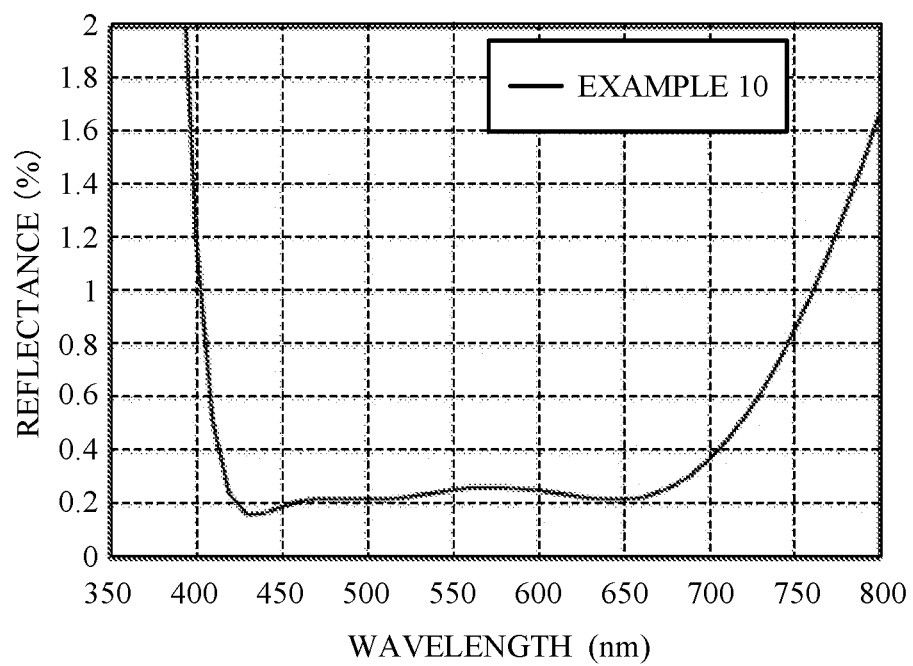
FIG. 11 indicates a reflectance characteristic at an incident angle of 0 degree of an optical element according to an Example 10.

A transparent resin substrate 200 in an Example 10 is made from COP resin (Zeon Corporation, "ZEONEX"). As layer material, layers 11, 13, 15, 01, and 03 use SiO$_2$ including Al at a weight ratio of 4.5%, layers 12, 14, and 16 use mixture of Ta$_2$O$_5$ and TiO$_2$, and a layer 02 uses MgF$_2$. Table 10 indicates details of a film configuration of the optical element in this example. A refractive index and a film thickness of each material satisfy the expressions (1), (2), and (3). FIG. 11 indicates a reflectance characteristic of the optical element in this example. In FIG. 11, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 10

|  |  |  | Refractive index (d-line) | Physical film thickness (nm) |
|---|---|---|---|---|
| Multilayer film 101 | Layer 03 | $SiO_2$ (Al content: weight ratios 4.5%) | 1.47 | 20.0 |
|  | Layer 02 | $MgF_2$ | 1.38 | 58.1 |
|  | Layer 01 | $SiO_2$ (Al content: weight ratios 4.5%) | 1.47 | 20.0 |
| Multilayer film 111 | Layer 16 | $Ta_2O_5 + TiO_2$ | 2.00 | 51.5 |
|  | Layer 15 | $SiO_2$ (Al content: weight ratios 4.5%) | 1.47 | 15.0 |
|  | Layer 14 | $Ta_2O_5 + TiO_2$ | 2.00 | 57.6 |
|  | Layer 13 | $SiO_2$ (Al content: weight ratios 4.5%) | 1.47 | 42.2 |
|  | Layer 12 | $Ta_2O_5 + TiO_2$ | 2.00 | 16.8 |
|  | Layer 11 | $SiO_2$ (Al content: weight ratios 4.5%) | 1.47 | 30.0 |
| Resin substrate 200 |  | COP resin | 1.53 | — |

Example 11

Figure 12:
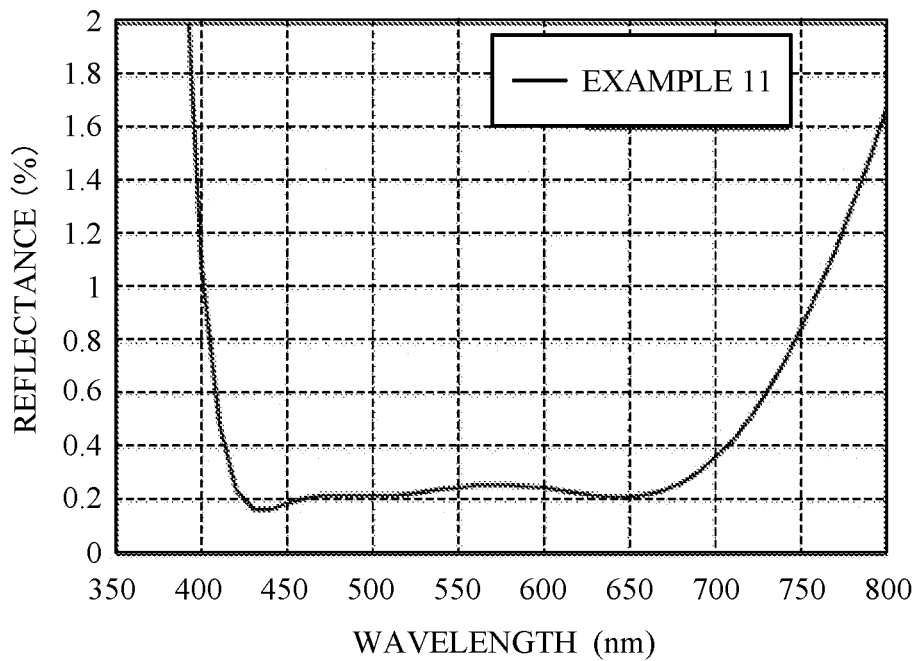
FIG. 12 indicates a reflectance characteristic at an incident angle of 0 degree of an optical element according to an Example 11.

A transparent resin substrate 200 in an Example 11 is made from COP resin (Zeon Corporation, "ZEONEX"). As layer material, layers 12, 14, 01, and 03 use $SiO_2$ including Al at a weight ratio of 5.2%, layers 11, 13, and 15 use mixture of $Ta_2O_5$ and $TiO_2$, and a layer 02 uses $MgF_2$. Table 11 indicates details of a film configuration of the optical element in this example. A refractive index and a film thickness of each material satisfy the expressions (1), (2), and (3). FIG. 12 indicates a reflectance characteristic of the optical element in this example. In FIG. 12, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 11

|  |  |  | Refractive index (d-line) | Physical film thickness (nm) |
|---|---|---|---|---|
| Multilayer film 101 | Layer 03 | $SiO_2$ (Al content: weight ratios 5.2%) | 1.47 | 20.0 |
|  | Layer 02 | $MgF_2$ | 1.38 | 56.0 |
|  | Layer 01 | $SiO_2$ (Al content: weight ratios 5.2%) | 1.47 | 20.0 |
| Multilayer film 111 | Layer 15 | $Ta_2O_5 + TiO_2$ | 2.00 | 52.9 |
|  | Layer 14 | $SiO_2$ (Al content: weight ratios 5.2%) | 1.47 | 10.0 |
|  | Layer 13 | $Ta_2O_5 + TiO_2$ | 2.00 | 64.1 |
|  | Layer 12 | $SiO_2$ (Al content: weight ratios 5.2%) | 1.47 | 36.0 |
|  | Layer 11 | $Ta_2O_5 + TiO_2$ | 2.00 | 15.4 |
| Resin substrate 200 |  | COP resin | 1.53 | — |

Example 12

Figure 13:
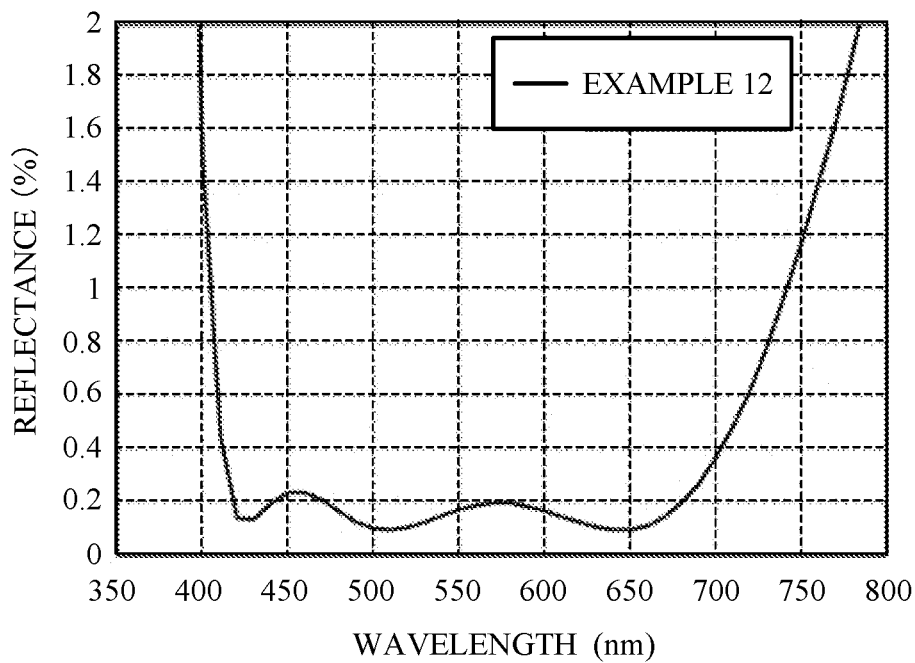
FIG. 13 indicates a reflectance characteristic at an incident angle of 0 degree of an optical element according to an Example 12.

A transparent resin substrate 200 in an Example 12 is made from special PC resin (Mitsubishi Gas Chemical Company, Inc., "EP-5000"). As layer material, layers 11, 13, 15, 01, and 03 use $SiO_2$ including Al at a weight ratio of 4.5%, layers 12, 14, and 16 use mixture of $Ta_2O_5$ and $TiO_2$, and a layer 02 uses $MgF_2$. Table 12 indicates details of a film configuration of the optical element in this example. A refractive index and a film thickness of each material satisfy the expressions (1), (2), and (3). FIG. 13 indicates a reflectance characteristic of the optical element in this example. In FIG. 13, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 12

|  |  |  | Refractive index (d-line) | Physical film thickness (nm) |
|---|---|---|---|---|
| Multilayer film 101 | Layer 03 | SiO$_2$ (Al content: weight ratios 4.5%) | 1.47 | 20.0 |
|  | Layer 02 | MgF$_2$ | 1.38 | 56.0 |
|  | Layer 01 | SiO$_2$ (Al content: weight ratios 4.5%) | 1.47 | 20.0 |
| Multilayer film 111 | Layer 16 | Ta$_2$O$_5$ + TiO$_2$ | 2.00 | 55.4 |
|  | Layer 15 | SiO$_2$ (Al content: weight ratios 4.5%) | 1.47 | 10.3 |
|  | Layer 14 | Ta$_2$O$_5$ + TiO$_2$ | 2.00 | 60.4 |
|  | Layer 13 | SiO$_2$ (Al content: weight ratios 4.5%) | 1.47 | 43.8 |
|  | Layer 12 | Ta$_2$O$_5$ + TiO$_2$ | 2.00 | 20.7 |
|  | Layer 11 | SiO$_2$ (Al content: weight ratios 4.5%) | 1.47 | 41.4 |
| Resin substrate 200 |  | Special PC | 1.64 | — |

Example 13

Figure 14:
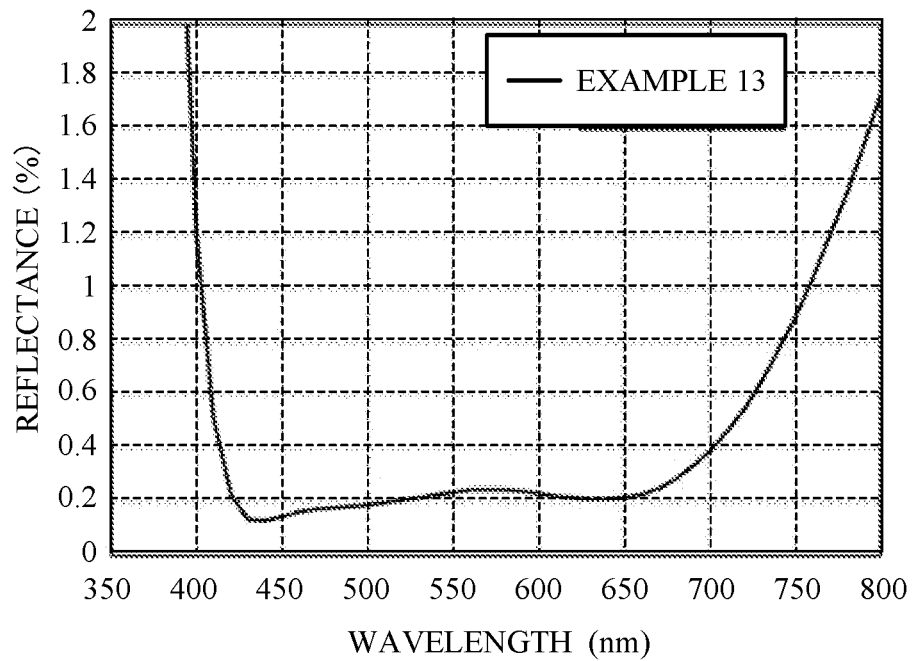
FIG. 14 indicates a reflectance characteristic at an incident angle of 0 degree of an optical element according to an Example 13.

A transparent resin substrate 200 in an Example 13 is made from special PC resin (Mitsubishi Gas Chemical Company, Inc., "EP-5000"). As layer material, layers 12, 14, 01, and 03 use SiO$_2$ including Al at a weight ratio of 10.0%, layers 11, 13, and 15 use mixture of Ta$_2$O$_5$ and TiO$_2$, and a layer 02 uses MgF$_2$. Table 13 indicates details of a film configuration of the optical element in this example. A refractive index and a film thickness of each material satisfy the expressions (1), (2), and (3). FIG. 14 indicates a reflectance characteristic of the optical element in this example. In FIG. 14, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 13

|  |  |  | Refractive index (d-line) | Physical film thickness (nm) |
|---|---|---|---|---|
| Multilayer film 101 | Layer 03 | SiO$_2$ (Al content: weight ratios 10.0%) | 1.47 | 20.0 |
|  | Layer 02 | MgF$_2$ | 1.38 | 56.2 |
|  | Layer 01 | SiO$_2$ (Al content: weight ratios 10.0%) | 1.47 | 20.0 |
| Multilayer film 111 | Layer 15 | Ta$_2$O$_5$ + TiO$_2$ | 2.00 | 47.4 |
|  | Layer 14 | SiO$_2$ (Al content: weight ratios 10.0%) | 1.47 | 10.0 |
|  | Layer 13 | Ta$_2$O$_5$ + TiO$_2$ | 2.00 | 55.9 |
|  | Layer 12 | SiO$_2$ (Al content: weight ratios 10.0%) | 1.47 | 27.5 |
|  | Layer 11 | Ta$_2$O$_5$ + TiO$_2$ | 2.00 | 16.8 |
| Resin substrate 200 |  | Special PC | 1.64 | — |

Example 14

Figure 15:
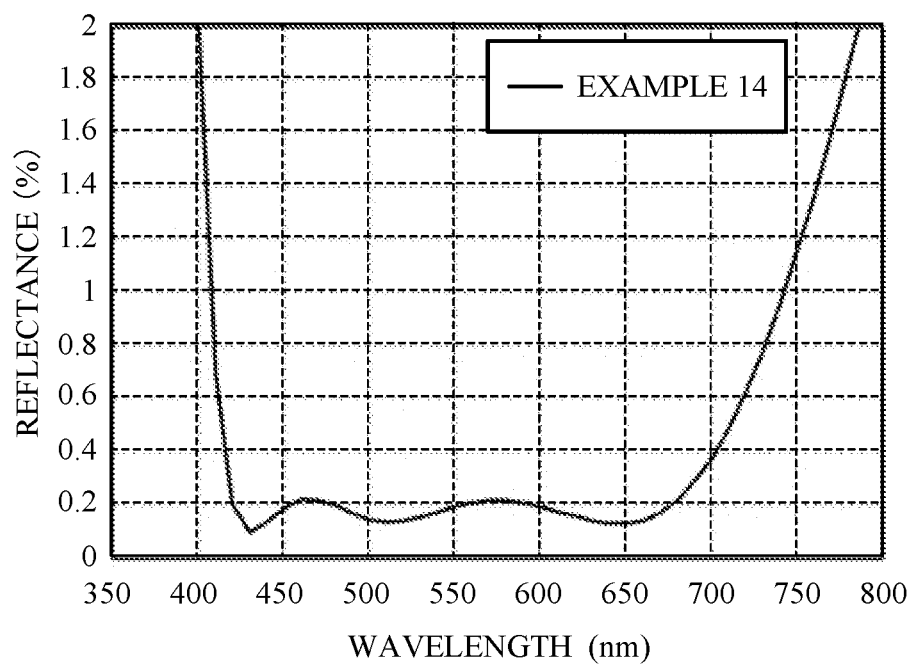
FIG. 15 indicates a reflectance characteristic at an incident angle of 0 degree of an optical element according to an Example 14.

A transparent resin substrate 200 in an Example 14 is made from polyester film (PET resin) (Toray Industries, Inc., "Lumirror T60"). As layer material, layers 11, 13, 15, 01, and 03 use SiO$_2$ including Al at a weight ratio of 5.2%, layers 12, 14, and 16 use mixture of Ta$_2$O$_5$ and TiO$_2$, and a layer 02 uses MgF$_2$. Table 14 indicates details of a film configuration of the optical element in this example. A refractive index and a film thickness of each material satisfy the expressions (1), (2), and (3). FIG. 15 indicates a reflectance characteristic of the optical element in this example. In FIG. 15, a horizontal axis represents wavelength (nm) and a vertical axis represents reflectance (%). The reflectance is 0.25% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 14

| | | | Refractive index (d-line) | Physical film thickness (nm) |
|---|---|---|---|---|
| Multilayer film 101 | Layer 03 | SiO$_2$ (Al content: weight ratios 5.2%) | 1.47 | 20.0 |
| | Layer 02 | MgF$_2$ | 1.38 | 57.4 |
| | Layer 01 | SiO$_2$ (Al content: weight ratios 5.2%) | 1.47 | 20.0 |
| Multilayer film 111 | Layer 16 | Ta$_2$O$_5$ + TiO$_2$ | 2.00 | 59.5 |
| | Layer 15 | SiO$_2$ (Al content: weight ratios 5.2%) | 1.47 | 15.0 |
| | Layer 14 | Ta$_2$O$_5$ + TiO$_2$ | 2.00 | 53.7 |
| | Layer 13 | SiO$_2$ (Al content: weight ratios 5.2%) | 1.47 | 53.2 |
| | Layer 12 | Ta$_2$O$_5$ + TiO$_2$ | 2.00 | 19.7 |
| | Layer 11 | SiO$_2$ (Al content: weight ratios 5.2%) | 1.47 | 44.7 |
| Resin substrate 200 | | PET | 1.65 | — |

Example 15

Figure 16:
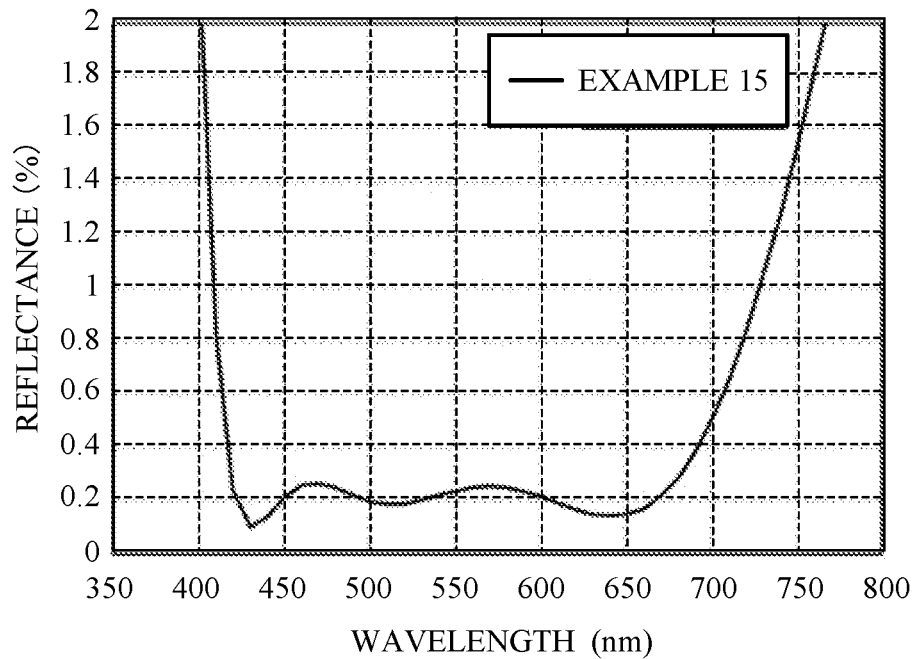
FIG. 16 indicates a reflectance characteristic at an incident angle of 0 degree of an optical element according to an Example 15.

A transparent resin substrate 200 in an Example 15 is made from polyester film (PET resin) (Toray Industries, Inc., "Lumirror T60"). As layer material, layers 11, 13, 15, 01, and 03 use SiO$_2$ including Al at a weight ratio of 5.2%, layers 12, 14, and 16 use mixture of Ta$_2$O$_5$ and TiO$_2$, and a layer 02 uses MgF$_2$. Table 15 indicates details of a film configuration of the optical element in this example. A refractive index and a film thickness of each material satisfy the expressions (1), (2), and (3). FIG. 16 indicates a reflectance characteristic of the optical element in this example. In FIG. 16, a horizontal axis represents wavelength (nm) and a vertical axis represents reflectance (%). The reflectance is 0.3% or less in a wavelength range of 420 to 680 nm, which is a very good characteristic.

Table 18 indicates the results of the durability tests. It could be confirmed that no film cracking or film peeling occurred in every test, and that a good antireflection film was formed.

TABLE 15

| | | | Refractive index (d-line) | Physical film thickness (nm) |
|---|---|---|---|---|
| Multilayer film 101 | Layer 03 | SiO$_2$ (Al content: weight ratios 5.2%) | 1.47 | 30.0 |
| | Layer 02 | MgF$_2$ | 1.38 | 35.4 |
| | Layer 01 | SiO$_2$ (Al content: weight ratios 5.2%) | 1.47 | 28.0 |
| Multilayer film 111 | Layer 16 | Ta$_2$O$_5$ + TiO$_2$ | 2.00 | 70.2 |
| | Layer 15 | SiO$_2$ (Al content: weight ratios 5.2%) | 1.47 | 15.1 |
| | Layer 14 | Ta$_2$O$_5$ + TiO$_2$ | 2.00 | 43.8 |
| | Layer 13 | SiO$_2$ (Al content: weight ratios 5.2%) | 1.47 | 65.4 |
| | Layer 12 | Ta$_2$O$_5$ + TiO$_2$ | 2.00 | 15.0 |
| | Layer 11 | SiO$_2$ (Al content: weight ratios 5.2%) | 1.47 | 51.6 |
| Resin substrate 200 | | PET | 1.65 | — |

Example 16

Figure 19:
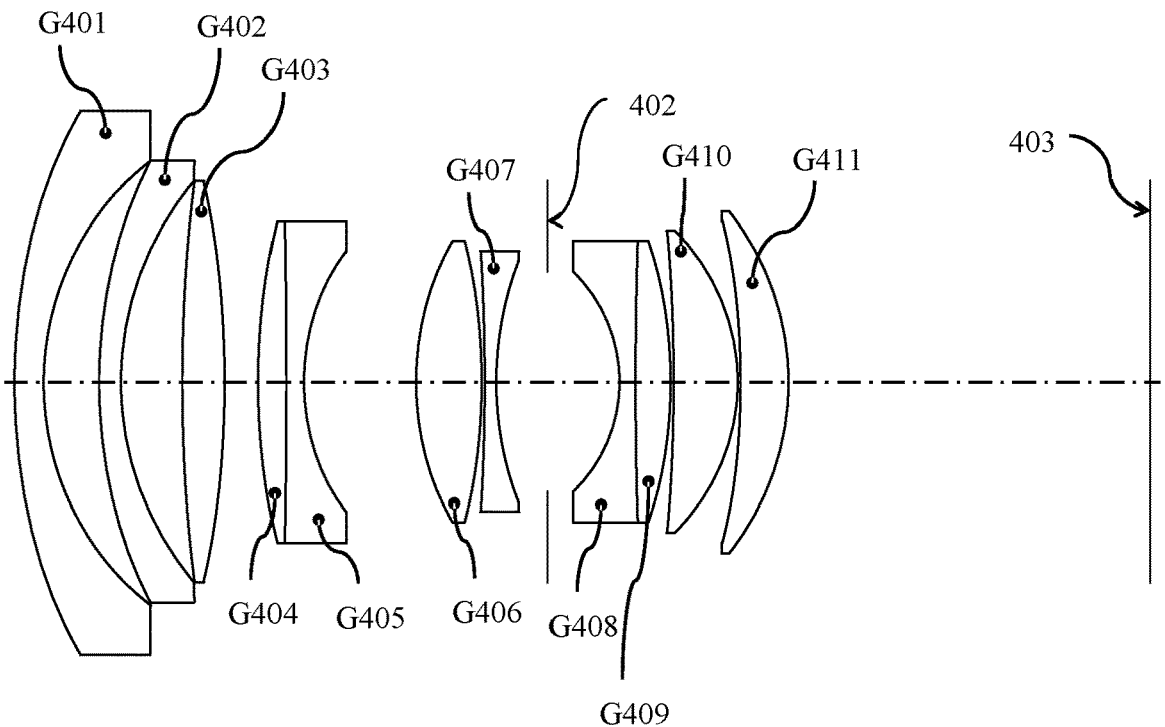
FIG. 19 is a sectional view illustrating an optical system according to an Example 16.

Next, a description will be given of an optical system in an Example 16 with reference to FIG. 19. FIG. 19 is a sectional view of an optical system 400. The optical system 400 includes a plurality of optical elements G401 to G411. A reference numeral 402 denotes a diaphragm and a reference numeral 403 denotes an image plane. The optical elements G401 to G411 are lenses, respectively. Of these lenses, at least one of entrance surfaces and emission surfaces is provided with the antireflection film according to any one of the Examples 1 to 15. That is, the optical system 400 includes the plurality of optical elements G401 to G411, and the plurality of optical elements G401 to G411 includes the optical element 300 provided with the antireflection film according to any one of the Examples 1 to 15.

The optical system 400 in this Example is not limited to an image pickup optical system used in an image pickup apparatus described later, and may be applied to optical systems for various purposes such as binoculars, projectors, and telescopes.

Example 17

Figure 20:
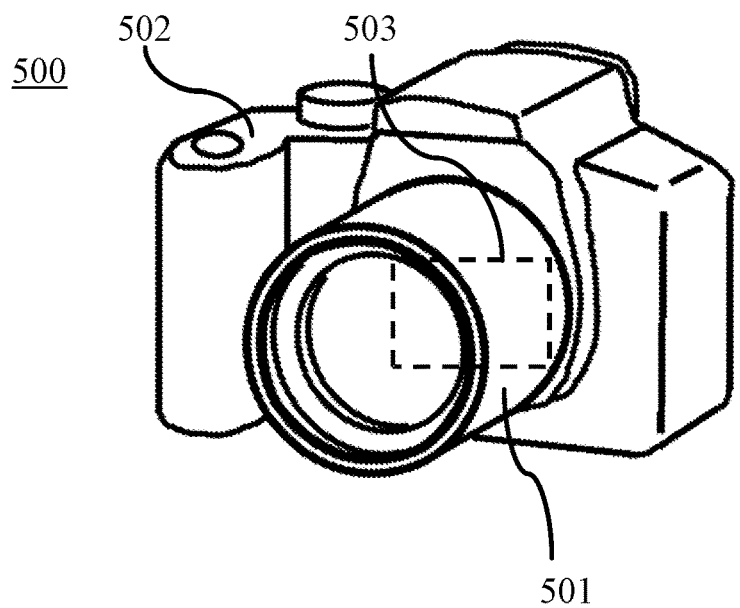
FIG. 20 is an external perspective view illustrating an image pickup apparatus according to an Example 17.

Next, a description will be given of an image pickup apparatus in an Example 17 with reference to FIG. 20. FIG. 20 is an external perspective view illustrating the image pickup apparatus (digital camera 500).

The digital camera 500 includes a camera body 502 and a lens apparatus 501 which is integrally configured with the camera body 502. However, this example is not limited to this, and the lens apparatus 501 may be an interchangeable lens, which is detachably attachable to the camera body 502, such as a lens for a single-lens reflex camera and a lens for a mirrorless camera. The lens apparatus 501 includes an optical system 400 according to any one of the Examples 1 to 15. The camera body 502 includes an image sensor 503 such as a CMOS sensor and a CCD sensor. The image sensor 503 is disposed on an image plane 403 in the optical system 400.

Comparative Example 1

Figure 17:
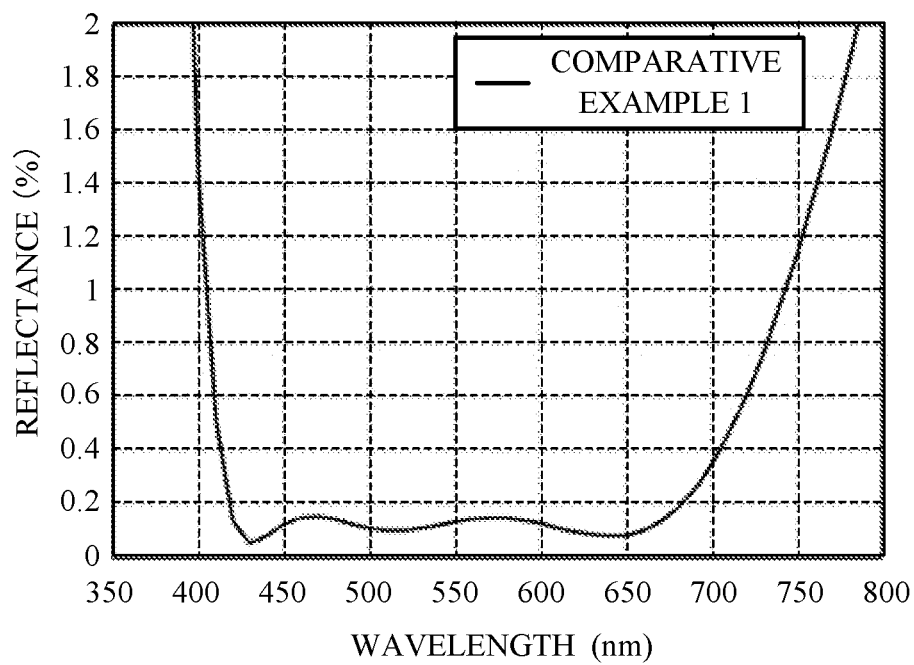
FIG. 17 indicates a reflectance characteristic at an incident angle of 0 degree of an optical element according to a Comparative Example 1.

A Comparative Example 1 uses the same vapor deposition material, the same transparent resin substrate, and the same vapor deposition condition as those in the Example 10. Table 16 indicates a film configuration of an optical element in this comparative example. A multilayer film 101 is made only of a magnesium fluoride layer. FIG. 17 indicates a reflectance characteristic of the optical element in this comparative example. In FIG. 17, a horizontal axis represents wavelength (nm) and a vertical axis represents reflectance (%). The reflectance is 0.2 or less in a wavelength range of 420 to 680 nm, achieving lower reflectance than those in the Examples 1 to 15.

Table 18 indicates the results of the durability tests. An outermost layer in this comparative example is made of a magnesium fluoride film having low strength. Therefore, in the configuration of this comparative example, film cracking and film peeling occur in each durability test, which is not suitable for use as an antireflection film.

TABLE 16

| | | | Refractive index (d-line) | Physical film thickness (nm) |
|---|---|---|---|---|
| Multilayer film 101 | Layer 01 | $MgF_2$ | 1.38 | 99.3 |
| Multilayer film 111 | Layer 16 | $Ta_2O_5 + TiO_2$ | 2.00 | 57.2 |
| | Layer 15 | $SiO_2$ (Al content: weight ratios 4.5%) | 1.47 | 15.0 |
| | Layer 14 | $Ta_2O_5 + TiO_2$ | 2.00 | 51.0 |
| | Layer 13 | $SiO_2$ (Al content: weight ratios 4.5%) | 1.47 | 54.7 |
| | Layer 12 | $Ta_2O_5 + TiO_2$ | 2.00 | 10.0 |
| | Layer 11 | $SiO_2$ (Al content: weight ratios 4.5%) | 1.47 | 90.9 |
| Resin substrate 200 | | COP resin | 1.53 | — |

Comparative Example 2

A Comparative Example 2 uses the same vapor deposition material, the same transparent resin substrate, and the same vapor deposition condition as those in the Example 10. Table 17 indicates a film configuration of an optical element in this comparative example. A multilayer film 101 is made only of a silicon oxide layer.

Table 18 indicates the results of the durability tests. An outermost layer in this comparative example is made of a silicon oxide film having high strength. Therefore, no film cracking and no film peeling occurred in every durability test.

Figure 18:
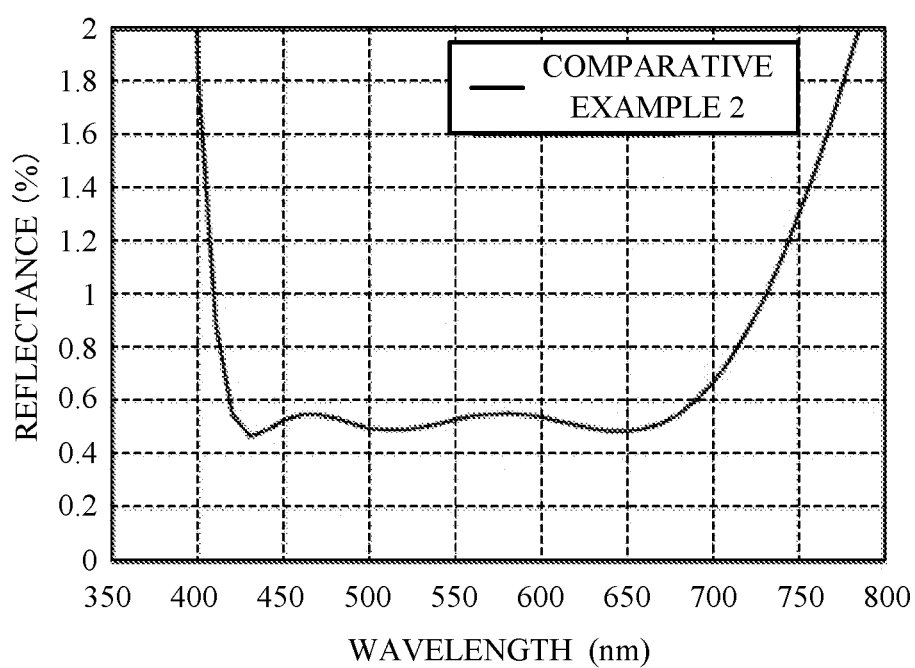
FIG. 18 indicates a reflectance characteristic at an incident angle of 0 degree of an optical element according to a Comparative Example 2.

FIG. 18 indicates a reflectance characteristic in this comparative example. In FIG. 18, a horizontal axis represents wavelength (nm) and a vertical axis represents reflectance (%). The reflectance is about 0.5% in a wavelength range of 420 to 680 nm, which is higher than those in the Examples 1 to 15. Thus, in the configuration of this comparative example, ghost and flare may be caused.

TABLE 17

| | | | Refractive index (d-line) | Physical film thickness (nm) |
|---|---|---|---|---|
| Multilayer film 101 | Layer 01 | $SiO_2$ (Al content: weight ratios 4.5%) | 1.47 | 92.6 |
| Multilayer film 111 | Layer 16 | $Ta_2O_5 + TiO_2$ | 2.00 | 69.9 |
| | Layer 15 | $SiO_2$ (Al content: weight ratios 4.5%) | 1.47 | 15.0 |
| | Layer 14 | $Ta_2O_5 + TiO_2$ | 2.00 | 43.7 |
| | Layer 13 | $SiO_2$ (Al content: weight ratios 4.5%) | 1.47 | 55.3 |
| | Layer 12 | $Ta_2O_5 + TiO_2$ | 2.00 | 12.5 |
| | Layer 11 | $SiO_2$ (Al content: weight ratios 4.5%) | 1.47 | 57.6 |
| Resin substrate 200 | | COP resin | 1.53 | — |

TABLE 18

| | Antireflection effect | High-temperature/ humidity shelf test | Low temperature shelf test | High-temperature shelf test | Adhesion test | Surface hardness test |
|---|---|---|---|---|---|---|
| Ex. 1 | ○ | ○ | ○ | ○ | ○ | ○ |
| Ex. 2 | ○ | ○ | ○ | ○ | ○ | ○ |

TABLE 18-continued

|  | Antireflection effect | High-temperature/ humidity shelf test | Low temperature shelf test | High-temperature shelf test | Adhesion test | Surface hardness test |
|---|---|---|---|---|---|---|
| Ex. 3 | ○ | ○ | ○ | ○ | ○ | ○ |
| Ex. 4 | ○ | ○ | ○ | ○ | ○ | ○ |
| Ex. 5 | ○ | ○ | ○ | ○ | ○ | ○ |
| Ex. 6 | ○ | ○ | ○ | ○ | ○ | ○ |
| Ex. 7 | ○ | ○ | ○ | ○ | ○ | ○ |
| Ex. 8 | ○ | ○ | ○ | ○ | ○ | ○ |
| Ex. 9 | ○ | ○ | ○ | ○ | ○ | ○ |
| Ex. 10 | ○ | ○ | ○ | ○ | ○ | ○ |
| Ex. 11 | ○ | ○ | ○ | ○ | ○ | ○ |
| Ex. 12 | ○ | ○ | ○ | ○ | ○ | ○ |
| Ex. 13 | ○ | ○ | ○ | ○ | ○ | ○ |
| Ex. 14 | ○ | ○ | ○ | ○ | ○ | ○ |
| Ex. 15 | ○ | ○ | ○ | ○ | ○ | ○ |
| Comparative Ex. 1 | ⊚ | crack appeared | crack appeared | crack appeared | film peeled | film peeled |
| Comparative Ex. 2 | X | ○ | ○ | ○ | ○ | ○ |

According to each example, it is possible to provide an optical element, an optical system, and an optical apparatus each of which has high mechanical strength and high environmental durability.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-181840, filed on Oct. 29, 2020 which is hereby incorporated by reference herein in its entirety.

What is claimed is:

1. An optical element comprising:
   a base material consisting of resin material; and
   an antireflection film consisting of:
      a first film formed on the base material; and
      a second film formed on the first film, and consisting of, in order from a side closest to the first film:
         a first layer;
         a second layer; and
         a third layer,
      wherein the first layer and the third layer each include silicon oxide at a weight ratio of 90% or more and aluminum at a weight ratio of 10% or less, and
      wherein the second layer includes magnesium fluoride.

2. The optical element according to claim 1, wherein the following conditional expression is satisfied:

$$\lambda/8 \leq n1d1 + n2d2 + n3d3 \leq \lambda/2,$$

where n1 represents a refractive index at a d-line of the first layer, n2 represents a refractive index at the d-line of the second layer, n3 represents a refractive index at the d-line of the third layer, d1 (nm) represents a physical film thickness of the first layer, d2 (nm) represents a physical film thickness of the second layer, d3 (nm) represents a physical film thickness of the third layer, and $\lambda$ (nm) represents a wavelength of the d-line.

3. The optical element according to claim 2, wherein [a] the following conditional expression is satisfied:

$$\lambda/6 \leq n1d1 + n2d2 + n3d3 \leq \lambda/3.$$

4. The optical element according to claim 1, wherein the following conditional expressions are satisfied:

$$0.2 \leq n2d2/(n1d1 + n2d2 + n3d3) \leq 0.9;\text{ and}$$

$$0.5 \leq n1d1/n3d3 \leq 2.0,$$

where n1 represents a refractive index at a d-line of the first layer, n2 represents a refractive index at the d-line of the second layer, n3 represents a refractive index at the d-line of the third layer, d1 (nm) represents a physical film thickness of the first layer, d2 (nm) represents a physical film thickness of the second layer, and d3 (nm) represents a physical film thickness of the third layer.

5. The optical element according to claim 4, wherein the following conditional expressions are satisfied:

$$0.3 \leq n2d2/(n1d1 + n2d2 + n3d3) \leq 0.7;\text{ and}$$

$$0.8 \leq d1/d3 \leq 1.2.$$

6. The optical element according to claim 1, wherein the following conditional expressions are satisfied:

$$1.4 \leq n1 \leq 1.5;\text{ and}$$

$$1.4 \leq n3 \leq 1.5,$$

where n1 represents a refractive index at a d-line of the first layer, and n3 represents a refractive index at the d-line of the third layer.

7. The optical element according to claim 1, wherein the first film is formed by alternately laminating:
   material included in each of the first layer and the third layer of the second film; and
   material including at least one of tantalum oxide, titanium oxide, lanthanum oxide, or zirconium oxide.

8. The optical element according to claim 1, wherein the following conditional expression is satisfied:

$$1.48 \leq nd \leq 1.80,$$

where nd represents an average refractive index at a d-line of the resin material.

9. The optical element according to claim 1, wherein the following conditional expression is satisfied:

$$1.5 \leq \alpha \leq 30.0,$$

where a ($10^{-5}/°$ C.) represents a coefficient of a linear expansion of the resin material.

10. An optical system comprising:
a plurality of optical elements each including:
    a base material consisting of resin material; and
    an antireflection film consisting of:
        a first film formed on the base material; and
        a second film formed on the first film, and consisting of, in order from a side closest to the first film:
            a first layer;
            a second layer; and
            a third layer,
        wherein the first layer and the third layer each include silicon oxide at a weight ratio of 90% or more and aluminum at a weight ratio of 10% or less, and
        wherein the second layer includes magnesium fluoride.

11. An optical apparatus comprising:
an image sensor; and
an optical element comprising:
    a base material consisting of resin material; and
    an antireflection film consisting of:
        a first film formed on the base material; and
        a second film formed on the first film, and consisting of, in order from a side closest to the first film:
            a first layer;
            a second layer; and
            a third layer,
        wherein the first layer and the third layer each include silicon oxide at a weight ratio of 90% or more and aluminum at a weight ratio of 10% or less, and
        wherein the second layer includes magnesium fluoride.

\* \* \* \* \*